(12) United States Patent
Oshima et al.

(10) Patent No.: US 7,271,404 B2
(45) Date of Patent: Sep. 18, 2007

(54) GROUP III-V NITRIDE-BASED SEMICONDUCTOR SUBSTRATE AND METHOD OF MAKING SAME

(75) Inventors: Yuichi Oshima, Tsuchiura (JP); Masatomo Shibata, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/312,634

(22) Filed: Dec. 21, 2005

(65) Prior Publication Data

US 2007/0051969 A1  Mar. 8, 2007

(30) Foreign Application Priority Data

Sep. 6, 2005  (JP) .............................. 2005-258387

(51) Int. Cl.
*H01L 29/06* (2006.01)
(52) U.S. Cl. .................. 257/11; 257/189; 257/200; 257/615; 257/E33.025; 257/E33.033
(58) Field of Classification Search .................. None
See application file for complete search history.

(56) References Cited

U.S. PATENT DOCUMENTS 5,290,393 A * 3/1994 Nakamura .................. 438/509
6,121,634 A * 9/2000 Saito et al. .................. 257/86
2006/0001352 A1* 1/2006 Maruta et al. .............. 313/486
2006/0175600 A1* 8/2006 Sato et al. .................. 257/14

FOREIGN PATENT DOCUMENTS

JP  04-297023 A  10/1992

OTHER PUBLICATIONS

A. Usui et al., "Thick GaN Epitaxial Growth with Low Dislocation Density by Hydride Vapor Phase Epitaxy", Jpn. J. Appl. Phys., vol. 36, pp. L899-L902, 1997.
O. Nam et al., "Lateral Epitaxy of Low Defect Density GaN Layers via Organometallic Vapor Phase Epitaxy", Appl. Phys. Lett., vol. 71, No. 18, pp. 2638-2640, 1997.

* cited by examiner

*Primary Examiner*—Sue A. Purvis
*Assistant Examiner*—Scott R. Wilson
(74) *Attorney, Agent, or Firm*—Foley & Lardner LLP

(57) ABSTRACT

A group III-V nitride-based semiconductor substrate having a group III-V nitride-based semiconductor thick film with a same composition in the entire film. The thick film has a first region with a predetermined impurity concentration and a second region with an impurity concentration lower than the first region.

8 Claims, 10 Drawing Sheets

12 Si-DOPED GaN THICK FILM
11 SAPPHIRE SUBSTRATE

15 GaN SELF-STANDING SUBSTRATE

22 Si, TI-DOPED GaN THICK FILM
21 SAPPHIRE SUBSTRATE

25 GaN SELF-STANDING SUBSTRATE

GROUP III-V NITRIDE-BASED SEMICONDUCTOR SUBSTRATE AND METHOD OF MAKING SAME

The present application is based on Japanese patent application No. 2005-258387, the entire contents of which are incorporated herein by reference.

BACKGROUND OF THE INVENTION

1. Field of the Invention

This invention relates to a group III-V nitride-based semiconductor substrate and, in particular, to a group III-V nitride-based semiconductor substrate that is suited for a substrate of a nitride-based semiconductor device such as a laser diode (LD) and light emitting diode (LD), and a method of making the same.

2. Description of the Related Art

Group III-V nitride-based semiconductor materials such as gallium nitride (GaN) have a wide bandgap and are of direct transition type. Therefore, they attract attention as a material for ultraviolet to blue light emitting device.

Thus far, a hetero-epitaxial substrate such as a sapphire substrate is used to make a GaN-based semiconductor light emitting device. However, it is not possible to grow a GaN single crystal film even directly on the sapphire substrate since the sapphire substrate has a lattice constant different from GaN.

JP-A-4-297023 discloses a method that an AlN or GaN buffer layer is in advance grown on a sapphire substrate at a low temperature, thereby reducing the lattice distortion, and then GaN is grown on the buffer layer. With such a low temperature growth buffer layer, it becomes possible to obtain an epitaxially grown single-crystal GaN. However, even in this method, lattice mismatch between the sapphire substrate and the grown crystal cannot be eliminated and GaN thus obtained has a number of defects.

In recent years, ELO (e.g., OK-Hyun Nam et al., "Lateral Epitaxy of Low Defect Density GaN Layers via Organometallic Vapor Phase Epitaxy", Appl. Phys. Lett. 71 (18) p 2638 (1997)) and FIELO (e.g., Akira Usui et al., "Thick GaN Epitaxial Growth with Low Dislocation Density by Hydride Vapor Phase Epitaxy", Jpn. J. Appl. Phys. Vol. 36, pp. L899-902 (1997)) are reported that are methods for reducing a defect density caused by lattice mismatch between sapphire and GaN. In these methods, a mask material such as $SiO_2$ is by photolithography formed partially on an underlying GaN single crystal film which is grown on a sapphire substrate by MOVPE (metalorganic vapor phase epitaxy), and GaN is subsequently grown thereon. Thereby, the propagation of dislocation from the underlying layer can be suppressed. Further, the high-quality GaN thick film thus obtained is separated by laser separation or etching etc. to have a GaN self-standing substrate.

However, the GaN self-standing substrate thus made is warped into a concave form in as-grown state. Such a warping is essential in the GaN growth method using the heteroepitaxy of Volmer-Weber growth mode. For example, when GaN is grown on a hetero-substrate such as sapphire, microscopic GaN islands are densely formed at the initial step of growth, and then they are enlarged according to the growth, combined with each other, finally forming a flattened plane, and transferred into two-dimensional growth. The islands attract each other to minimize the surface energy when being combined, and a tensile stress is generated thereby. Further, even after the combination, contraction in volume occurs due to elimination of grain boundary along with the growth. It is assumed that these cause the concave warping. Although the warping can be lessened to some degree by control at the initial step of the growth, it is difficult to reduce the warping to zero thereby.

It is found by the inventors that a kind of doping in the growth of GaN functions to increase the warping.

FIG. 14 is a graph showing the relationship between a Si doping concentration and a warping of GaN substrate when Si is uniformly doped into GaN. In view of this graph, it is found that the warping increases as Si concentration in GaN crystal increases.

FIG. 15 is a graph showing the relationship between a thickness and a warping of doping layer when its doping concentration is set to be constant ($5 \times 10^{18}$ cm$^{-3}$) and the doping layer is formed on its upper surface side. In view of this graph, it is found that the warping increases as the thickness of the doping layer increases.

FIG. 16 is a graph showing the relationship between a doping start position and a warping of doping layer when Si is doped at a concentration of $5 \times 10^{18}$ cm$^{-3}$ and the doping layer has a thickness of 100 μm. In view of this graph, it is found that the warping depends on the doping start position in thickness direction, and the warping rapidly increases when the doping starts from a position near the seed substrate.

The correlation between the doping and the warping as shown in FIGS. 14 to 16 is assumed to be caused by a change in lattice constant due to Ga or N site being replaced by an element with a different atomic radius. Thus, although the doping is needed to provide a necessary conductivity for the GaN substrate, it can cause a further increase of the warping.

As described, due to the GaN growth mechanism and the doping, the GaN self-standing substrate is warped into the concave form in as-grown state.

Even when both surfaces of the substrate being concave-warped in as-grown state are apparently polished to be flattened, the substrate must have a distribution in crystal orientation since the outer shape thereof is only corrected.

Therefore, when a light emitting device is fabricated on such a substrate, the emission wavelength will be distributed according to the orientation distribution of the substrate. This is assumed because the step density varies due to the difference of surface orientation and, therefore, amount of In taken in varies when an active layer of InGaN etc. is grown thereon. This causes a decrease in device yield eventually.

SUMMARY OF THE INVENTION

It is an object of the invention to provide a group III-V nitride-based semiconductor substrate that can have a reduced crystal orientation distribution by controlling the impurity profile in a group III-V nitride-based semiconductor thick film.

It is a further object of the invention to provide a method of making the group III-V nitride-based semiconductor substrate.

The inventors studied the doping position and concentration, kind of dopant, doping profile etc. in view of the problem that the doping causes a further increase of the warping. As a result, the inventors can find that the warping can be reduced by (a) minimizing the doped region, (b) doping a second impurity that can compensate the lattice reduction due to the doping of a first impurity, and (c) controlling the doping profile to cancel the warping etc.

(1) According to one aspect of the invention, a group III-V nitride-based semiconductor substrate comprises:

a group III-V nitride-based semiconductor thick film comprising a same composition in the entire film, wherein the thick film comprises a first region with a predetermined impurity concentration and a second region with an impurity concentration lower than the first region.

In the above invention, the following modifications and changes can be made.

(i) The thick film comprises a GaN thick film, the first region is doped with Si at a concentration of $1 \times 10^{18}$ cm$^{-3}$ or more and $7 \times 10^{18}$ cm$^{-3}$ or less, and the second region is undoped.

(2) According to another aspect of the invention, a group III-V nitride-based semiconductor substrate comprises:

a group III-V nitride-based semiconductor thick film comprising a same composition in the entire film, wherein the thick film comprises a first impurity to adjust a resistivity thereof and a second impurity to compensate a lattice distortion thereof caused by the first impurity.

In the above invention, the following modifications and changes can be made.

(ii) The first impurity and the second impurity are doped together into a predetermined region in the thick film.

(iii) The first impurity and the second impurity are doped separately into different regions in the thick film.

(iv) The thick film comprises a first region formed on an upper surface side thereof, a second region formed on a lower surface side thereof and a third region formed between the first region and the second region, the first region comprises the first impurity, the second region comprises the second impurity, and the third region comprises the first impurity and the second impurity each of which changes gradually in concentration.

(3) According to another aspect of the invention, a group III-V nitride-based semiconductor substrate comprises:

a group III-V nitride-based semiconductor thick film comprising a same composition in the entire film, wherein the thick film comprises a first region with a predetermined impurity concentration, a second region with an impurity concentration lower than the first region, and a third region formed between the first region and the second region, and the third region comprises an impurity concentration greater than the first region.

In the above invention, the following modifications and changes can be made.

(v) The first region is formed on an upper surface side of the thick film, the first region comprising a thickness of 100 µm or more, the second region is formed on an lower surface side of the thick film, and the third region comprises a thickness of 50 µm or less.

(4) According to another aspect of the invention, a method of making a group, III-V nitride-based semiconductor substrate comprises the steps of:

epitaxially growing a group III-V nitride-based semiconductor thick film on a substrate;

separating the thick film from the substrate; and polishing one or both surfaces of the thick film to have the group III-V nitride-based semiconductor substrate, wherein the epitaxial growth step comprises a first step of forming a first region with no impurity doped thereinto, and a second step of forming a second region with an impurity doped thereinto at a predetermined concentration, and the epitaxial growth step is conducted to satisfy $0.01 \leq t_2/t_1 \leq 1.5$, where $t_1$ is a thickness of the first region and $t_2$ is a thickness of the second region.

In the above invention, the following modifications and changes can be made.

(vi) $t_1$ is 300 µm or more and 500 µm or less, and $t_2$ is 300 µm or less.

(5) According to another aspect of the invention, a method of making a group III-V nitride-based semiconductor substrate comprises the steps of:

epitaxially growing a group III-V nitride-based semiconductor thick film on a substrate;

separating the thick film from the substrate; and polishing one or both surfaces of the thick film to have the group III-V nitride-based semiconductor substrate, wherein the epitaxial growth step comprises a first step of forming a first region with no impurity doped thereinto, and a second step of forming a second region into which a first impurity to adjust a resistivity thereof and a second impurity different than the first impurity to compensate a lattice distortion thereof caused by the first impurity are doped together.

(6) According to another aspect of the invention, a method of making a group III-V nitride-based semiconductor substrate comprises the steps of:

epitaxially growing a group III-V nitride-based semiconductor thick film on a substrate;

separating the thick film from the substrate; and polishing one or both surfaces of the thick film to have the group III-V nitride-based semiconductor substrate, wherein the epitaxial growth step comprises a first step of forming a first region into which a first impurity to compensate a lattice distortion thereof caused by a second impurity different than the first impurity is doped, and a second step of forming a second region into which the second impurity to adjust a resistivity thereof is doped.

(7) According to another aspect of the invention, a method of making a group III-V nitride-based semiconductor substrate comprises the steps of:

epitaxially growing a group III-V nitride-based semiconductor thick film on a substrate;

separating the thick film from the substrate; and polishing one or both surfaces of the thick film to have the group III-V nitride-based semiconductor substrate, wherein the epitaxial growth step comprises a first step of forming a first region into which a first impurity to compensate a lattice distortion thereof caused by a second impurity different than the first impurity is doped, a second step of forming a second region in which the first impurity decreases gradually toward a third region and the second impurity to adjust a resistivity thereof increases toward the third region, and a third step of forming the third region into which the second impurity is doped.

(8) According to another aspect of the invention, a method of making a group III-V nitride-based semiconductor substrate comprises the steps of:

epitaxially growing a group III-V nitride-based semiconductor thick film on a substrate;

separating the thick film from the substrate; and polishing one or both surfaces of the thick film to have the group III-V nitride-based semiconductor substrate, wherein the epitaxial growth step comprises a first step of forming a first region with no impurity doped thereinto, a second step of forming a second region into which an impurity is doped at a predetermined concentration, and a third step of forming a third region into which the impurity is doped at a concentration lower than the impurity concentration of the second region.

In the above invention, the following modifications and changes can be made.

(vii) The second region comprises a thickness of 50 μm or less, and the third region comprises a thickness of 100 μm or more.

(viii) The substrate comprises a sapphire substrate.

BRIEF DESCRIPTION OF THE DRAWINGS

The preferred embodiments according to the invention will be explained below referring to the drawings, wherein:

FIGS. 1A and 1B are cross sectional views showing a group III nitride-based semiconductor substrate in a first preferred embodiment according to the invention, wherein FIG. 1A shows a Si-doped GaN thick film and FIG. 1B shows its GaN self-standing substrate;

FIGS. 4A and 4B are cross sectional views showing a group III nitride-based semiconductor substrate in a second preferred embodiment according to the invention, wherein FIG. 4A shows a Si, Tl-doped GaN thick film and FIG. 4B shows its GaN self-standing -substrate;

FIGS. 5A and 5B are cross sectional views showing a group III nitride-based semiconductor substrate in a third preferred embodiment according to the invention, wherein FIG. 5A shows a Si, B-doped GaN thick film and FIG. 5B shows its GaN self-standing substrate;

FIGS. 6A and 6B are cross sectional views showing a group III nitride-based semiconductor substrate in a fourth preferred embodiment according to the invention, wherein FIG. 6A shows a Ge, B-doped GaN thick film and FIG. 6B shows its GaN self-standing substrate;

FIGS. 7A and 7B are cross sectional views showing a group III nitride-based semiconductor substrate in a fifth preferred embodiment according to the invention, wherein FIG. 7A shows a Ge-doped GaN thick film and FIG. 7B shows its GaN self-standing substrate;

DETAILED DESCRIPTION OF THE PREFERRED EMBODIMENTS

First Embodiment

Composition of the First Embodiment

Figure 1A:
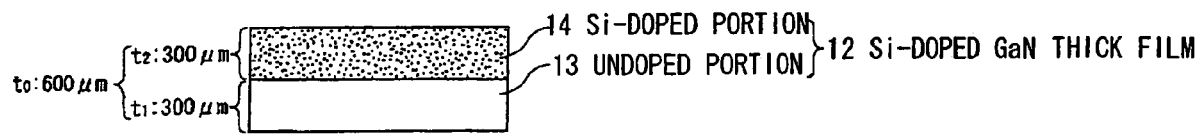

FIG. 1A shows a Si-doped GaN thick film of the first embodiment.

The Si-doped GaN thick film 12 has a whole thickness of 600 μm and comprises an undoped portion 13 (with thickness $t_1$ of 300 μm) into which no dopant is doped, and a Si-doped portion 14 (with a thickness $t_2$ of 300 μm) which is formed thereon and into which Si is doped at a predetermined concentration.

Figure 16:
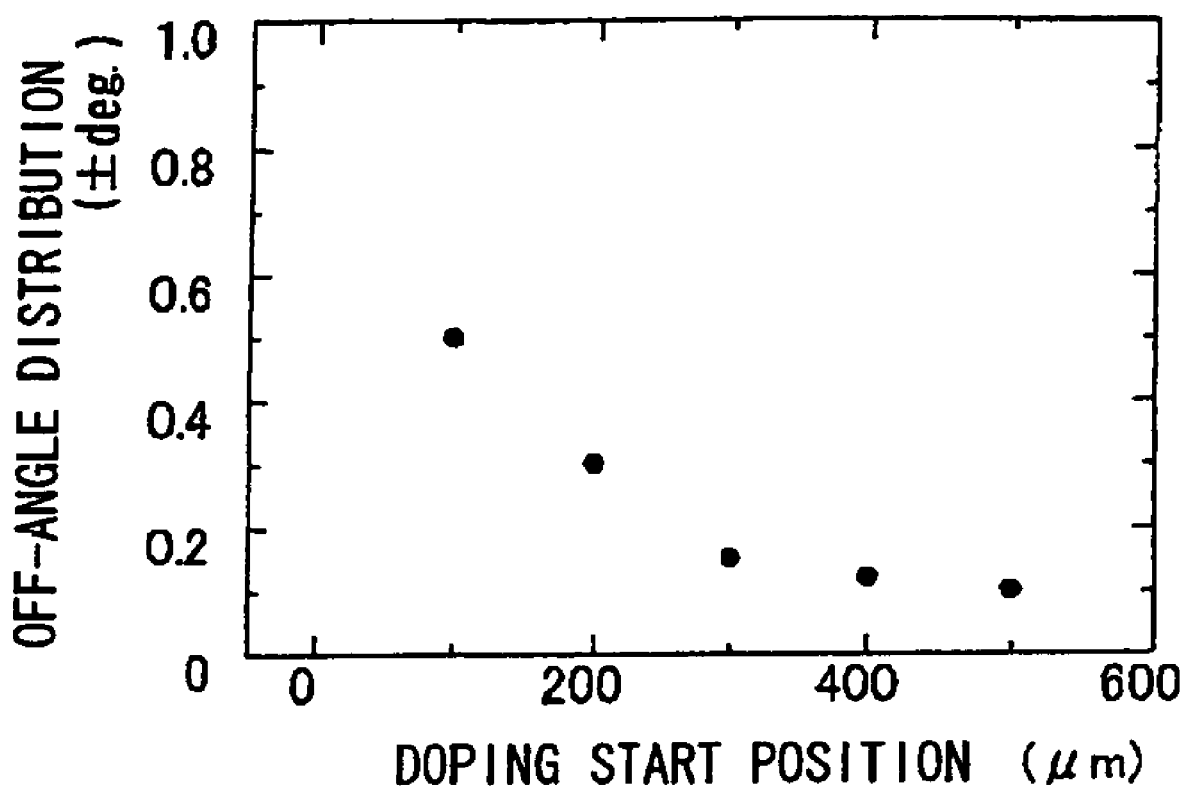
FIG. 16 is a graph showing the relationship between a doping start position and a warping of doping layer when Si is doped at a concentration of $5 \times 10^{18}$ cm$^{-3}$ and the doping layer has a thickness of 100 μm.

It is desired that the undoped portion 13 has a thickness $t_1$ of 300 μm or more and 500 μm or less. This is because, as shown in FIG. 16, the warping significantly decreases when the doping start position is 300 μm or more and this tendency continues up to 500 μm.

Figure 15:
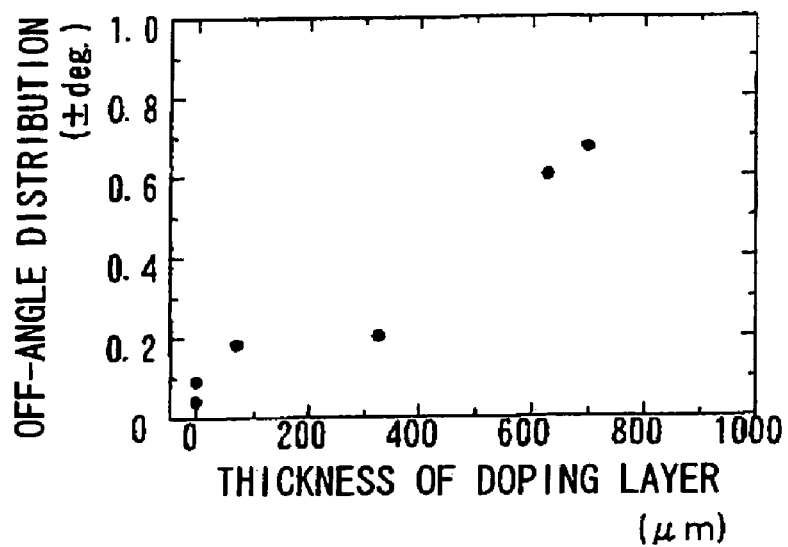
FIG. 15 is a graph showing the relationship between a thickness and a warping of doping layer when its doping concentration is set to be constant ($5 \times 10^{18}$ cm$^{-3}$) and the doping layer is formed on the surface side.

It is desired that the Si-doped portion 14 has a thickness $t_2$ of 300 μm or less. This is because, as shown in FIG. 15, the warping significantly decreases when the doping layer has a thickness of 300 μm or less.

In the structure as shown in FIG. 1A, a ratio $t_2/t_1$ of the thickness t2 of the Si-doped portion 14 to the thickness $t_1$ of the undoped portion 13 is 1. As such, it is preferred that $t_2/t_1$ is 0.01 or more and 1.5 or less in order to obtain a sufficient warping decreasing effect. If $t_2/t_1$ is more than 1.5, the sufficient warping decreasing effect cannot be obtained since the rigidity of the undoped portion 13 is small to magnitude of stress generated. On the contrary, if $t_2/t_1$ is less than 0.01, the stress relaxation of the Si-doped portion 14 does not occur to cause a cracking since the rigidity of the undoped portion 13 is too large.

Doping Concentration, Resistivity

It is preferred that the Si-doped portion 14 has a Si concentration of $1 \times 10^{18}$ or more and $7 \times 10^{18}$ or less cm$^{-3}$ (or a resistivity of 0.02 or less Ωcm). If less than $1 \times 10^{18}$ cm$^{-3}$, an electrode with a sufficiently low contact resistance cannot be formed at the bottom of the device. If more than $7 \times 10^{18}$ cm$^{-3}$, the warping or crystalline quality will be badly affected.

The Si-doped GaN thick film 12 is formed by epitaxially growing, in sequence, the undoped portion 13 and the Si-doped portion 14 on a sapphire substrate (not shown), and then removing them from the sapphire substrate. In the epitaxial growth, since the thicknesses $t_1$, $t_2$ and the ratio $t_2/t_1$ are set as described earlier, the Si-doped GaN thick film 12 with the warping reduced can be obtained after the sapphire substrate is removed.

Figure 1B:
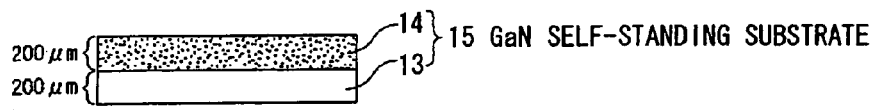

FIG. 1B shows a 400 μm thick GaN self-standing substrate 15 obtained by polishing 100 μm each both surfaces of the Si-doped GaN thick film 12 as shown in FIG. 1A.

The GaN self-standing substrate 15 may be made such that, after growing 600 μm in advance as shown in FIG. 1A, it is finished to have a predetermined thickness (e.g., 400 μm in the embodiment) by polishing etc. or that it is directly grown to have the predetermined thickness.

Absorption Coefficient

When a GaN self-standing substrate is used for a light emitting device, it is advantageous that the substrate has a lower light absorption to an emission wavelength.

Figure 2:
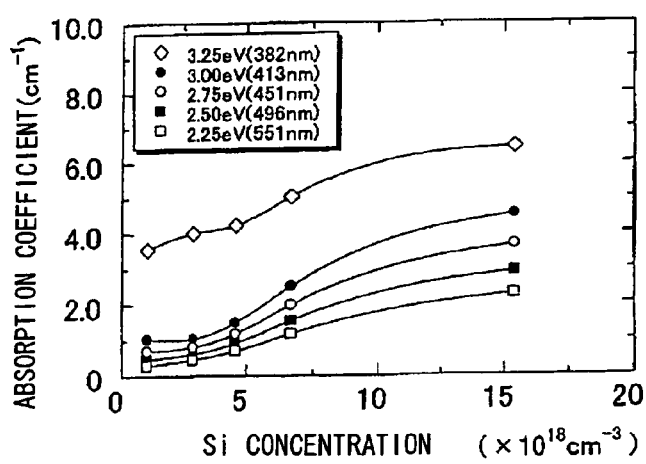
FIG. 2 is a graph showing the relationship between a Si doping concentration and a substrate absorption coefficient.

FIG. 2 is a graph showing the relationship between a Si doping concentration and a substrate absorption coefficient.

In view of this graph, it is found that the substrate absorption coefficient to light with energy of 3.4, which is the bandgap energy of GaN, or less eV increases as the Si doping concentration increases.

In fabricating a light emitting device, the GaN self-standing substrate 15 is lapped back up to a thickness of 100 to 200 μm. In this embodiment, the lapped-back portion is the undoped portion 13 (with a thickness of 200 μm) without Si doping as shown in FIG. 1B. Thus, since Si is doped into only a minimum portion practically used for the light emitting device, the absorption coefficient to light with a wavelength of 380 nm or more can be kept as low as 5 cm$^{-1}$ or less.

Substrate Thermal Conductivity

Figure 3:
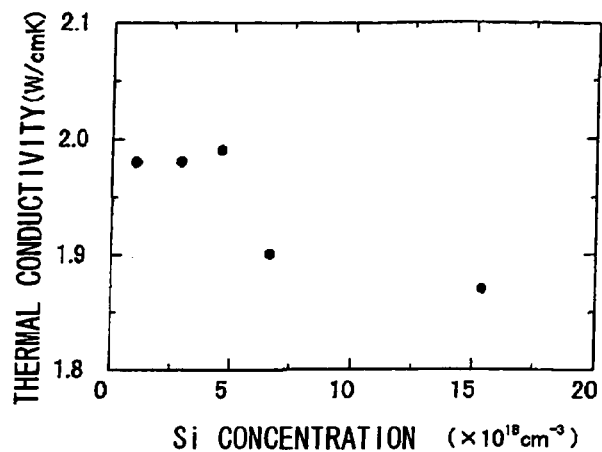
FIG. 3 is a graph showing the relationship between a Si doping concentration and a substrate thermal conductivity.

FIG. 3 is a graph showing the relationship between a Si doping concentration and a substrate thermal conductivity.

In view of this graph, it is found that the substrate thermal conductivity decreases as the Si doping concentration increases. If the thermal conductivity decreases, the temperature uniformity of the substrate during the epitaxial growth will be badly affected. This problem becomes serious as the substrate increases in surface area.

In this embodiment, the portion lapped back in the device fabricating process is the undoped portion 13 (with a thickness of 200 μm) without Si doping as shown in FIG. 1B. Thus, since Si is doped into only a necessary portion practically used to minimize the doped region of the GaN self-standing substrate, the reduction of the thermal conductivity can be prevented such that the entire GaN self-standing substrate 15 has an average thermal conductivity of 1.9 W/cmK or more.

Effects of the First Embodiment (1) If the entire GaN thick film is doped as in the conventional method, the warping increases as the doping concentration increases, thereby causing a large dispersion in crystal orientation. In contrast, in this embodiment, the warping can be reduced since the thicknesses $t_1$, $t_2$ and the ratio $t_2/t_1$ during the epitaxial growth are set so as to dope only the predetermined portion of the GAN thick film. Thus, the dispersion in crystal orientation distribution can be reduced for the same doping concentration, and the doping concentration can be increased for the same dispersion in crystal orientation distribution. For example, a GaN self-standing substrate can be made such that it is 25 mm or more in diameter and its crystal orientation dispersion is reduced as small as ±0.3 degrees or less in crystal orientation distribution. Therefore, when a light emitting device is fabricated thereon, the in-plane distribution of emission wavelength can be significantly improved. As a result, a high process yield can be obtained.

(2) Its device formation layer (i.e., its surface layer) can have an electrical resistivity of 0.02 Ωcm or less. The device operating voltage can be sufficiently lowered and the electrode can be formed in good ohmic contact.

(3) Since the portion lapped back in the device forming process is not doped and the minimum portion is doped, the absorption coefficient to light with a wavelength of 380 nm or more can be kept as low as 5 cm$^{-1}$ or less. Thus, a light emitting device can be fabricated that allows reduced light absorption to emission wavelength to have good energy efficiency.

(4) Since the portion lapped back in the device forming process is not doped and the minimum portion is doped, the entire GaN self-standing substrate 15 can have an average thermal conductivity of 1.9 W/cmK or more. Thus, in epitaxially growing GaN etc. on the substrate, the temperature distribution of the substrate can be uniformed to form a uniform epitaxial layer thereon.

Second Embodiment

Composition of the Second Embodiment

Figure 4A:
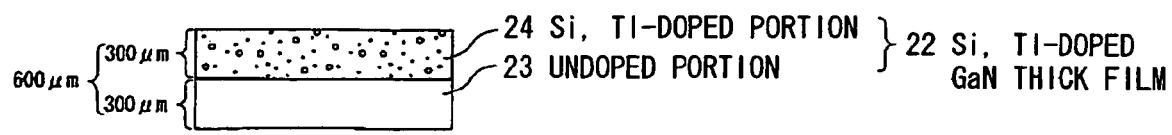

FIG. 4A shows a Si, Tl-doped GaN thick film of the second embodiment.

The Si, Tl-doped GaN thick film 22 has a whole thickness of 600 μm and comprises an undoped portion 23 (with thickness of 300 μm) into which no dopant is doped, and a Si, Tl-doped portion 24 (with a thickness of 300 μm) which is formed thereon and into which Si and Tl are doped at a predetermined concentration.

It is assumed that warping is affected by doping since a lattice mismatch to its underlying substrate varies when Ga or N is replaced by an ion with a different bond radius. In this embodiment, the doped layer is structured such that Si as a first dopant is doped together with a second dopant Tl for compensating the lattice distortion. Thus, the lattice mismatch can be compensated by doping a different kind of dopant with a different bond radius to reduce the warping.

It is preferred that, like the first embodiment, the first dopant, Si is doped at a concentration of $1\times10^{18}$ or more and $7\times10^{18}$ or less cm$^{-3}$ (or a resistivity of 0.02 Ωcm or less). On the other hand, it is preferred that the second dopant, Tl for compensating the lattice distortion is doped at a concentration of $1\times10^{18}$ or more and $3\times10^{18}$ or less cm$^{-3}$; although the doping concentration varies depending on the kind (ionization radius) of the second dopant. If less than $1\times10^{18}$ cm$^{-3}$, the effect of compensating the lattice distortion cannot be obtained. If more than $3\times10^{18}$ cm, the crystalline quality will be badly affected.

The Si, Tl-doped GaN thick film 22 is formed by epitaxially growing, in sequence, the undoped portion 23 and the Si, Tl-doped portion 24 on a sapphire substrate (not shown), and then removing them from the sapphire substrate. In the epitaxial growth, since Si and Tl for compensating the lattice distortion due to Si doping are doped only into the predetermined portion as described earlier, the Si, Tl-doped GaN thick film 22 with the warping reduced can be obtained after the sapphire substrate is removed.

Figure 4B:
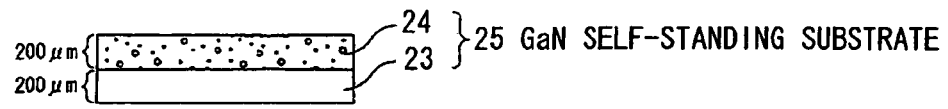

FIG. 4B shows a 400 μm thick GaN self-standing substrate 25 obtained by polishing 100 μm each both surfaces of the Si, Tl-doped GaN thick film 22 as shown in FIG. 4A.

Effects of the Second Embodiment

Like the GaN self-standing substrate 15 of the first embodiment, the GaN self-standing substrate 25 of this embodiment can be made such that it is 25 mm or more in diameter and its crystal orientation dispersion is reduced as small as ±0.3 degrees or less in crystal orientation distribution, its device formation layer (i.e., its surface layer) can have an electrical resistivity of 0.02 Ωcm or less, its absorption coefficient to light with a wavelength of 380 nm or more is kept as low as 5 cm$^{-1}$ or less, and the entire substrate has an average thermal conductivity of 1.9 W/cmK or more.

Third Embodiment

Composition of the Third Embodiment

Figure 5A:
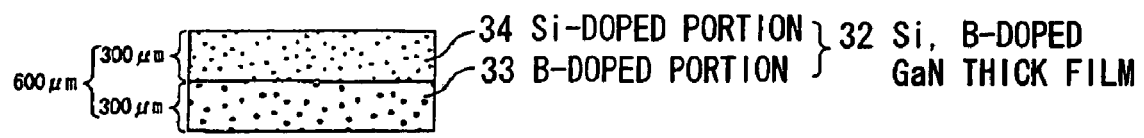

FIG. 5A shows a Si, B-doped GaN thick film of the third embodiment.

The Si, B-doped GaN thick film 32 has a whole thickness of 600 μm and comprises a B-doped portion 33 (with a thickness of 300 μm) into which B is doped at a predetermined concentration, and a Si-doped portion 34 (with a thickness of 300 μm) which is formed thereon and into which Si is doped at a predetermined concentration.

The Si, B-doped GaN thick film 32 is composed such that the first dopant, Si and the second dopant, B for compensating the lattice distortion are doped into the Si-doped portion 34 and the B-doped portion 33, respectively to compensate the lattice mismatch to reduce the warping. Thus, since the dopants are not doped together into one portion but separately doped into the two portions, the Si-doped portion 34 and the B-doped portion 33, respectively. Therefore, as compared to the case of doping together the dopants into one portion, dislocation density can be reduced to have good electrical, optical and thermal characteristics.

It is preferred that, like the first embodiment, the first dopant, Si is doped at a concentration of $1 \times 10^{18}$ or more and $7 \times 10^{18}$ or less $cm^{-3}$ (or a resistivity of 0.02 Ωcm or less). On the other hand, it is preferred that the second dopant, B for compensating the lattice distortion is doped at a concentration of $1 \times 10^{18}$ or more and $7 \times 10^{18}$ or less $cm^{-3}$, although the doping concentration varies depending on the kind (ionization radius) of the second dopant. If less than $1 \times 10^{18}$ $cm^{-3}$, the effect of compensating the lattice distortion cannot be obtained. If more than $7 \times 10^{18}$ $cm^{-3}$, the crystalline quality will be badly affected.

The Si, B-doped GaN thick film 32 is formed by epitaxially growing, in sequence, the B-doped portion 33 and the Si-doped portion 34 on a sapphire substrate (not shown), and then removing them from the sapphire substrate. In the epitaxial growth, since Si and B for compensating the lattice distortion due to Si doping are doped into the separate portions as described earlier, the Si, B-doped GaN thick film 32 with the warping reduced can be obtained after the sapphire substrate is removed.

Figure 5B:
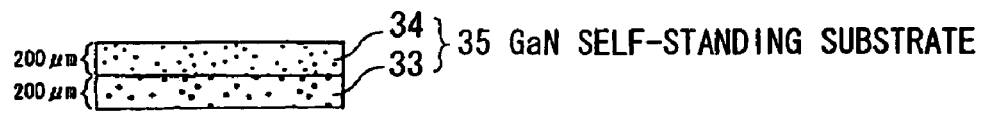

FIG. 5B shows a 400 μm thick GaN self-standing substrate 35 obtained by polishing 100 μm each both surfaces of the Si, B-doped GaN thick film 32 as shown in FIG. 5A.

Effects of the Third Embodiment

In the GaN self-standing substrate 35 of this embodiment, the substrate back portion to be lapped back in the device fabricating process is the B-doped portion 33 for compensating the warping as shown in FIG. 5B. Therefore, the warping can be further reduced as compared to the case of having this portion undoped.

Like the GaN self-standing substrate 15 of the first embodiment, the GaN self-standing substrate 35 of this embodiment can be made such that it is 25 mm or more in diameter and its crystal orientation dispersion is reduced as small as ±0.3 degrees or less in crystal orientation distribution, its device formation layer (i.e., its surface layer) can have an electrical resistivity of 0.02 Ωcm or less, its absorption coefficient to light with a wavelength of 380 nm or more is kept as low as 5 $cm^{-1}$ or less, and the entire substrate has an average thermal conductivity of 1.9 W/cmK or more.

Fourth Embodiment

Composition of the Fourth Embodiment

Figure 6A:
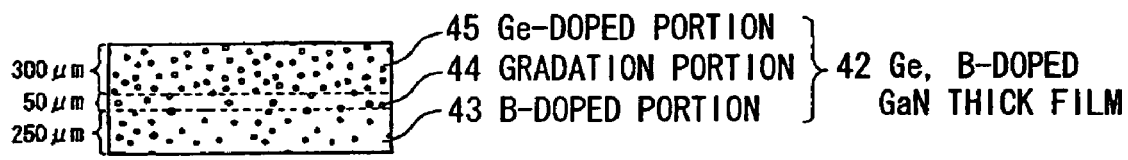

FIG. 6A shows a Ge, B-doped GaN thick film of the fourth embodiment.

The Ge, B-doped GaN thick film 42 has a whole thickness of 600 μm and comprises a B-doped portion 43 (with a thickness of 250 μm) into which B is doped at a predetermined concentration, a gradation portion 44 (with a thickness of 50 μm) which is formed thereon and B and Ge are doped at a concentration gradually changed in the thickness direction, and a Ge-doped portion 45 (with a thickness of 300 μm) which is formed thereon and into which Ge is doped at a predetermined concentration.

The gradation portion 44 is composed such that the Ge concentration is gradually changed to be the highest, i.e., the same as the Ge-doped portion 45, at a region adjacent to the Ge-doped portion 45 and to be zero at a region adjacent to the opposite B-doped portion 43. On the other hand, the B concentration is gradually changed to be the highest, i.e., the same as the B-doped portion 43, at a region adjacent to the B-doped portion 43 and to be zero at a region adjacent to the opposite Ge-doped portion 45.

It is preferred that the first dopant, Ge is doped at a concentration of $1 \times 10^{18}$ or more and $7 \times 10^{18}$ or less $cm^{-3}$ in the Ge-doped portion 45. On the other hand, it is preferred that the second dopant, B for compensating the lattice distortion is doped at a concentration of $1 \times 10^{18}$ or more and $7 \times 10^{18}$ or less $cm^{-3}$ in the B-doped portion 43, although the doping concentration varies depending on the kind (ionization radius) of the second dopant. If less than $1 \times 10^{18}$ $cm^{-3}$, the effect of compensating the lattice distortion cannot be obtained. If more than $7 \times 10^{18}$ $cm^{-3}$ the crystalline quality will be badly affected.

This embodiment is, like the third embodiment, provided with a multilayer structure that has a doping profile to cancel the warping. Furthermore, by changing the dopant concentration gradually, additional generation of dislocation at the interface can be reduced to have good electrical, optical and thermal characteristics.

The Ge, B-doped GaN thick film 42 is formed by epitaxially growing, in sequence, the B-doped portion 43, the gradation portion 44 and the Ge-doped portion 45 on a sapphire substrate (not shown), and then removing them from the sapphire substrate. In the epitaxial growth, since Ge and B for compensating the lattice distortion are doped into the separate portions as described earlier, the Ge, B-doped GaN thick film 42 with the warping reduced can be obtained after the sapphire substrate is removed.

Figure 6B:
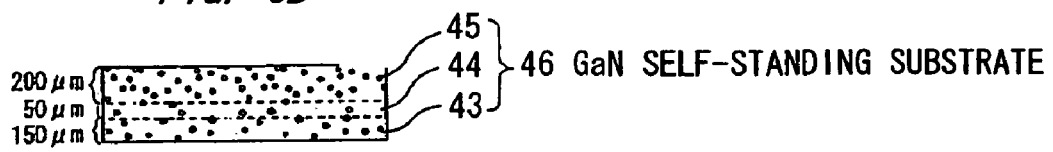

FIG. 6B shows a 400 μm thick GaN self-standing substrate 46 obtained by polishing 100 μm each both surfaces of the Ge, B-doped GaN thick film 42 as shown in FIG. 6A.

Effects of the Fourth Embodiment

In the GaN self-standing substrate 46 of this embodiment, the substrate back portion to be lapped back in the device fabricating process is the B-doped portion 43 for compensating the warping as shown in FIG. 6B. Therefore, the warping can be further reduced as compared to the case of having this portion undoped.

Like the GaN self-standing substrate 15 of the first embodiment, the GaN self-standing substrate 46 of this embodiment can be made such that it is 25 mm or more in diameter and its crystal orientation dispersion is reduced as small as ±0.3 degrees or less in crystal orientation distribution, its device formation layer (i.e., its surface layer) can have an electrical resistivity of 0.02 Ωcm or less, its absorption coefficient to light with a wavelength of 380 nm or more is kept as low as 5 cm$^{-1}$ or less, and the entire substrate has an average thermal conductivity of 1.9 W/cmK or more.

Fifth Embodiment

Composition of the Fifth Embodiment

Figure 7A:
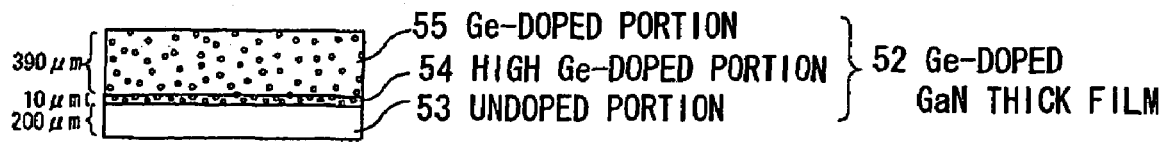

FIG. 7A shows a Ge-doped GaN thick film of the fifth embodiment.

The Ge-doped GaN thick film 52 has a whole thickness of 600 μm and comprises an undoped portion 53 (with a thickness of 200 μm) into which no dopant is doped, a high Ge-doped portion 54 (with a thickness of 10 μm) which is formed thereon and Ge is doped at a high concentration, and a Ge-doped portion 55 (with a thickness of 390 μm) which is formed thereon and into which Ge is doped at a low concentration.

It is preferred that Ge is doped at a concentration of $1 \times 10^{18}$ or more and $4 \times 10^{18}$ or less cm$^{-3}$ in the Ge-doped portion 55. On the other hand, it is preferred that Ge is doped at a concentration of $4 \times 10^{18}$ or more and $7 \times 10^{18}$ or less cm$^{-3}$ in the high Ge-doped portion 54.

The Ge-doped GaN thick film 52 is formed by epitaxially growing, in sequence, the undoped portion 53, the high Ge-doped portion 54 and the Ge-doped portion 55 on a sapphire substrate (not shown), and then removing them from the sapphire substrate. In the epitaxial-growth, since Ge is doped only into the predetermined portion, the Ge-doped GaN thick film 52 with the warping reduced can be obtained after the sapphire substrate is removed.

Figure 7B:
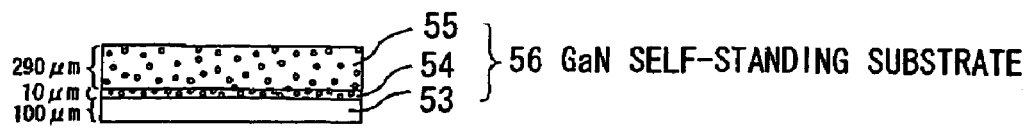

FIG. 7B shows a 400 μm thick GaN self-standing substrate 56 obtained by polishing 100 μm each both surfaces of the Ge-doped GaN thick film 52 as shown in FIG. 7A.

Effects of the Fourth Embodiment

In the GaN self-standing substrate 56 of this embodiment, only the near-back face portion to form a back electrode thereon after being lapped back in the device fabricating process is the high Ge-doped portion 54 to increase the doping concentration as shown in FIG. 7B. The other Ge-doped portion is the Ge-doped portion 55 to be subjected to a minimum doping to lower sufficiently the bulk resistivity. Thus, the substrate 56 has a multilayer structure.

Therefore, like the GaN self-standing substrate 15 of the first embodiment, the GaN self-standing substrate 56 of this embodiment can be made such that it is 25 mm or more in diameter and its crystal orientation dispersion is reduced as small as ±0.3 degrees or less in crystal orientation distribution, its device formation layer (i.e., its surface layer) can have an electrical resistivity of 0.02 Ωcm or less, its absorption coefficient to light with a wavelength of 380 nm or more is kept as low as 5 cm$^{-1}$ or less, and the entire substrate has an average thermal conductivity of 1.9 W/cmK or more.

EXAMPLES

Examples of the invention will be described below comparing with a conventional example.

Conventional Example (Example of doping Si into entire region of GaN thick film)

Figure 8A:
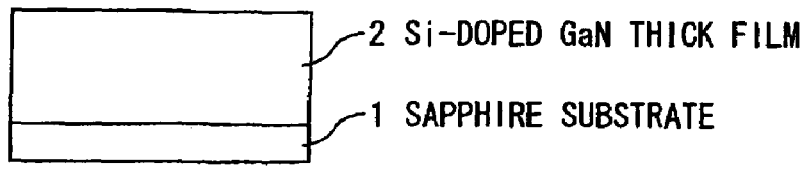
FIGS. 8A to 8C are cross sectional views showing a method of making a conventional GaN self-standing substrate.
Figure 8B:
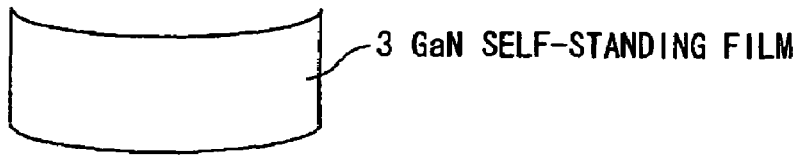
Figure 8C:
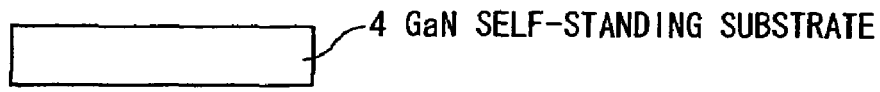

FIGS. 8A to 8C are cross sectional views showing a method of making a conventional GaN self-standing substrate where Si is doped into the entire region of a GaN thick film.

First, a Si-doped GaN thick film 2 with a thickness of 600 μm is grown on a C-face single crystal sapphire substrate 1 with a diameter of 2 inches by HVPE (hydride vapor phase epitaxy) (FIG. 8A).

In the HVPE, a HVPE furnace used is an apparatus that is operable to carry GaCl$_3$ as a halogenide of group III to the substrate, and GaCl$_3$ is produced by reacting Ga metal with HCl supplied with carrier gas such as H$_2$, N$_2$. In substrate region, GaCl$_3$ is mixed and reacted with NH$_3$ to grow GaN in vapor phase on the substrate. Temperature in the substrate region is set to be 1050° C. by an electric oven. The partial pressures of GaCl$_3$ and NH$_3$ as source materials in the substrate region are set to be $5 \times 10^{-4}$ atm and $5 \times 10^{-3}$ atm, respectively. Si is doped with SiH$_2$Cl$_2$. The doping is conducted from the start until the end of the growth to the entire thickness. By SIMS analysis after the growth, it is found that the Si concentration is $7 \times 10^{18}$ cm$^{-3}$.

After the growth, GaN at the interface is decomposed by irradiating YAG laser thereto from the side of the sapphire substrate 1 to separate the Si-doped GaN thick film 2 from the sapphire substrate 1. A GaN self-standing substrate 3 separated is extremely warped in concave form (FIG. 8B).

Then, by mirror-polishing both sides thereof, a GaN self-standing substrate 4 apparently having no warping is obtained (FIG. 8C). However, it is found by measuring the orientation distribution of the GaN self-standing substrate 4 by X-ray that an orientation distribution of ±1.3 degrees at the maximum exists in φ2" plane. This is because the warped substrate is only flattened apparently by the polishing. substrates made under the same conditions have a C-axis directional optical absorption coefficient of 5 cm$^{-1}$ (λ=382 nm), an electrical resistivity of 0.004 Ωcm and a thermal conductivity of 1.9 W/cmK.

Then, the substrate is placed in a MOVPE apparatus, and a blue LED epitaxial layer including an InGaN active layer is grown subsequently thereon. It is found by photoluminescence that the in-plane distribution of emission wavelengths to the central wavelength is as much as ±30 nm.

Example 1

(Example of doping Si into the predetermined region of the GaN thick film)

Figure 9A:
FIGS. 9A to 9C are cross sectional views showing a method of making the GaN self-standing substrate of the first embodiment.
Figure 9B:
Figure 9C:
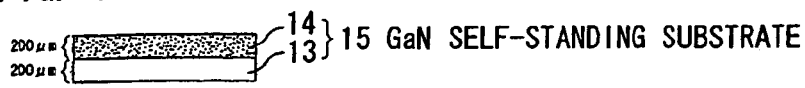

FIGS. 9A to 9C are cross sectional views showing a method of making the GaN self-standing substrate of the first embodiment.

As shown in FIG. 9A, the Si-doped GaN thick film 12 with a thickness of 600 μm is grown on the sapphire substrate 11 in a manner similar to the above conventional example. However, the doping is not, conducted from the start of the growth up to 300 μm to have the undoped portion 13, and the Si doping is subsequently conducted from 300 μm to 600 μm like the conventional example to have the Si-doped portion 14 (FIG. 9A).

After the growth, the Si-doped GaN thick film 12 is separated from the sapphire substrate 11 like the conventional example (FIG. 9B), and then both surfaces thereof are polished 100 μm each to have the GaN self-standing substrate 15 with a thickness of 400 μm (FIG. 9C).

Thus, Si is doped only into up to 200 μm from the upper surface of the GaN self-standing substrate 15.

It is found by measuring the orientation distribution of this substrate by X-ray that only an orientation distribution of ±0.2 degrees at the maximum exists in φ2" plane and is significantly improved as compared to the conventional example. substrates made under the same conditions have a C-axis directional optical absorption coefficient of 4.4 cm$^{-1}$ ($\lambda$=382 nm) and a thermal conductivity of 1.94 W/cmK, which are also improved as compared to the conventional example. Further, the doped portion has an electrical resistivity of 0.004 $\Omega$cm, which is equal to the conventional example.

Then, the substrate is placed in the MOVPE apparatus, and a blue LED epitaxial layer including an InGaN active layer is grown subsequently thereon. It is found by photoluminescence that the in-plane distribution of emission wavelengths to the central wavelength lowers to ±5 nm.

Example 2

(Example of doping Si and Tl together into the predetermined region of the GaN thick film)

Figure 10A:
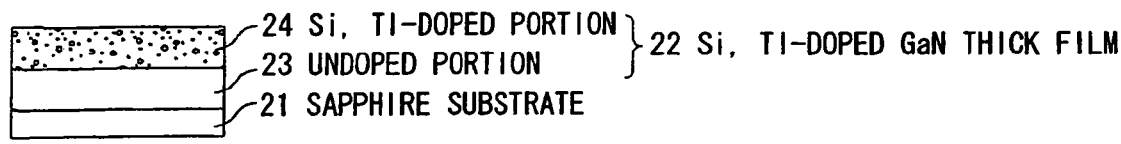
FIGS. 10A to 10C are cross sectional views showing a method of making the, GaN self-standing substrate of the second embodiment.
Figure 10B:
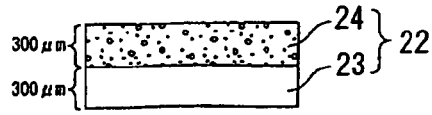
Figure 10C:
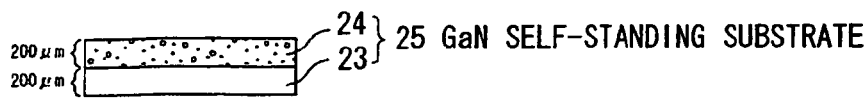

FIGS. 10A to 10C are cross sectional views showing a method of making the GaN self-standing substrate of the second embodiment.

As shown in FIG. 10A, the Si, Tl-doped GaN thick film 22 with a thickness of 600 µm is grown on the sapphire substrate 21 in a manner similar to the above conventional example. However, the doping is not conducted from the start of the growth up to 300 µm to have the undoped portion 23, and the Si, Tl doping is subsequently conducted from 300 µm to 600 µm like the conventional example to have the Si, Tl-doped portion 24 (FIG. 10A). Amount of Si doped is the same as the conventional example and amount of Tl doped is $1.5 \times 10^{18}$ cm$^{-3}$.

After the growth, the Si, Tl-doped GaN thick film 22 is separated from the sapphire substrate 21 like the conventional example (FIG. 10B), and then both surfaces thereof are polished 100 µm each to have the GaN self-standing substrate 25 with a thickness of 400 µm (FIG. 10C).

Thus, Si and Tl are doped only into up to 200 µm from the upper surface of the GaN self-standing substrate 25.

It is found by measuring the orientation distribution of this substrate by X-ray that only an orientation distribution of ±0.05 degrees at the maximum exists in φ2" plane and is significantly improved as compared to the conventional example. substrates made under the same conditions have a C-axis directional optical absorption coefficient of 4.8 cm$^{-1}$ ($\lambda$=382 nm) and a thermal conductivity of 1.92 W/cmK, which are also improved as compared to the conventional example. Further, the doped portion has an electrical resistivity of 0.007 $\Omega$cm, which is sufficient low.

Then, the substrate is placed in the MOVPE apparatus, and a blue LED epitaxial layer including an InGaN active layer is grown subsequently thereon. It is found by photoluminescence that the in-plane distribution of emission wavelengths to the central wavelength lowers to ±2 nm.

Example 3

(Example of forming separately the, Si-doped portion and the B-doped portion in the GaN thick film)

Figure 11A:
FIGS. 11A to 11C are cross sectional views showing a method of making the GaN self-standing substrate of the third embodiment.
Figure 11B:
Figure 11C:
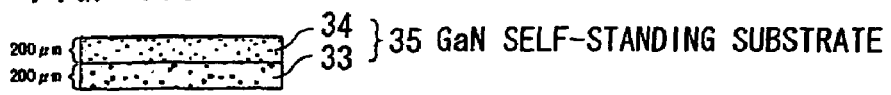

FIGS. 11A to 11C are cross sectional views showing a method of making the GaN self-standing substrate of the third embodiment.

As shown in FIG. 11A, the Si, B-doped GaN thick film 32 with a thickness of 600 µm is grown on the sapphire substrate 31 in a manner similar to the above conventional example. However, the B doping is conducted at a concentration of $5 \times 10^{18}$ cm$^3$ from the start of the growth up to 300 µm to have the B-doped portion 33, and the Si doping is subsequently conducted from 300 µm to 600 µm like Example 1 to have the Si-doped portion 34 (FIG. 11A).

After the growth, the Si, B-doped GaN thick film 32 is separated from the sapphire substrate 31 like the conventional example (FIG. 11B), and then both surfaces thereof are polished 100 µm each to have the GaN self-standing substrate 35 with a thickness of 400 µm (FIG. 11C).

Thus, Si is doped into up to 200 µm from the upper surface of the GaN self-standing substrate 35 and B is doped into up to 200 µm from the lower surface of the GaN self-standing substrate 35.

It is found by measuring the orientation distribution of this substrate by X-ray that only an orientation distribution of ±0.05 degrees at the maximum exists in φ2" plane and is significantly improved as compared to the conventional example. substrates made under the same conditions have a C-axis directional optical absorption coefficient of 4.7 cm$^{-1}$ ($\lambda$=382 nm) and a thermal conductivity of 1.93 W/cmK, which are also improved as compared to the conventional example. Further, the Si-doped portion has an electrical resistivity of 0.004 $\Omega$cm, which is equal to the conventional example.

Then, the substrate is placed in the MOVPE apparatus, and a blue LED epitaxial layer including an InGaN active layer is grown subsequently thereon. It is found by photoluminescence that the in-plane distribution of emission wavelengths to the central wavelength lowers to ±2 nm.

Example 4

(Example of changing gradually the Ge concentration and the B concentration in the GaN thick film)

Figure 12A:
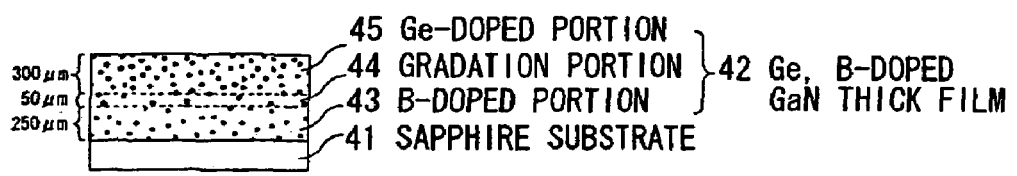
FIGS. 12A to 12C are cross sectional views showing a method of making the GaN self-standing substrate of the fourth embodiment.
Figure 12B:
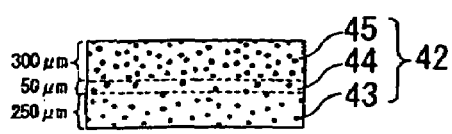
Figure 12C:
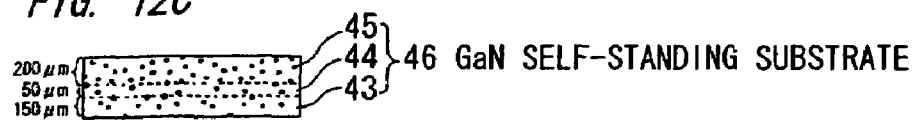

FIGS. 12A to 12C are cross sectional views showing a method of making the GaN self-standing substrate of the fourth embodiment.

As shown in FIG. 12A, the Ge, B-doped GaN thick film 42 with a thickness of 600 µm is grown on the sapphire substrate 41 in a manner similar to the above conventional example. However, the B doping is conducted at a concentration of $5 \times 10^{18}$ cm$^{-3}$ from the start of the growth up to 250 µm to have the B-doped portion 43. Then, in the gradation portion 44 from 250 µm to 300 µm, the B doping is gradually reduced to a concentration of zero at 300 µm and the Ge doping is gradually increased from 250 µm to have a concentration of $7 \times 10^{18}$ cm$^{-3}$ at 300 µm. Further, the Ge doping is conducted from 300 µm to 600 µm to have the Ge-doped portion 45 with a concentration of $7 \times 10^{18}$ cm$^{-3}$ (FIG. 12A).

After the growth, the Ge, B-doped GaN thick film 42 is separated from the sapphire substrate 41 like the conventional example (FIG. 12B), and then both surfaces thereof are polished 100 µm each to have the GaN self-standing substrate 46 with a thickness of 400 µm (FIG. 12C)

It is found by measuring the orientation distribution of this substrate by X-ray that only an orientation distribution of ±0.03 degrees at the maximum exists in φ2" plane and is significantly improved as compared to the conventional example. substrates made under the same conditions have a C-axis directional optical absorption coefficient of 4.7 cm$^{-1}$ ($\lambda$=382 nm) and a thermal conductivity of 1.93 W/cmK, which are also improved as compared to the conventional example. Further, the Ge-doped portion has an electrical resistivity of 0.004 $\Omega$cm, which is equal to the conventional example.

Then, the substrate is placed in the MOVPE apparatus, and a blue LED epitaxial layer including an InGaN active layer is grown subsequently thereon. It is found by photoluminescence that the in-plane distribution of emission wavelengths to the central wavelength lowers to ±1 nm.

Example 5

(Example of doping Ge at a high concentration into the predetermined region in the GaN thick film)

FIGS. 13A to 13E are cross sectional views showing a method of making the GaN self-standing substrate of the fifth embodiment.

Figure 13A:
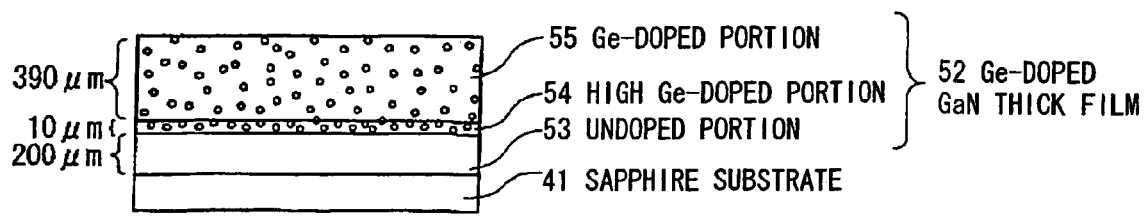
FIGS. 13A to 13E are cross sectional views showing a method of making the GaN self-standing substrate of the fifth embodiment.
Figure 13B:
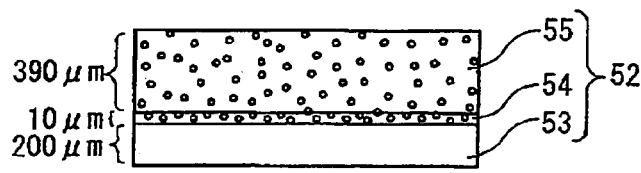

As shown in FIG. 13A, the Ge-doped GaN thick film 52 with a thickness of 600 μm is grown on the sapphire substrate 51 in a manner similar to the above conventional example. However, the doping is not conducted from the start of the growth up to 200 μm to have the undoped portion 53, and then the Ge doping is conducted at a high concentration of $7 \times 10^{18}$ cm$^{-3}$ from 200 μm to 210 μm to have the high Ge-doped portion 54. Then, the Ge doping is conducted at a concentration of $1 \times 10^{18}$ cm$^{-3}$ in the remaining portion to have the Ge-doped portion 55 (FIG. 13A).

Figure 13C:
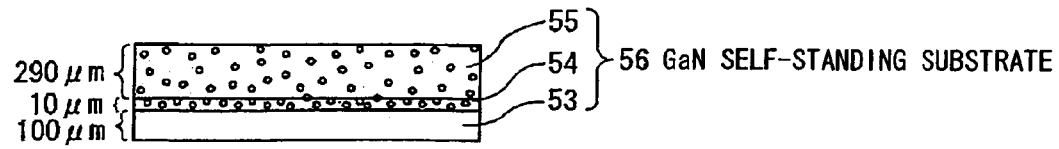
Figure 13D:
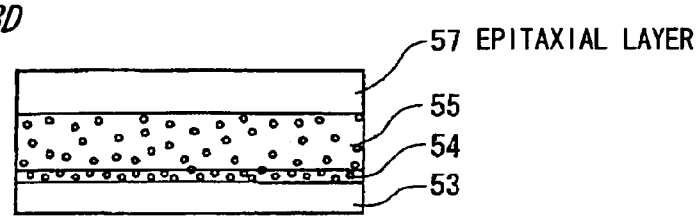

After the growth, the Ge-doped GaN thick film 52 is separated from the sapphire substrate 51 like the conventional example (FIG. 13B), and then both surfaces thereof are polished 100 μm each to have the GaN self-standing substrate 56 with a thickness of 400 μm (FIG. 13C).

It is found by measuring the orientation distribution of this substrate by X-ray that only an orientation distribution of ±0.05 degrees at the maximum exists in φ2" plane and is significantly improved as compared to the conventional example. substrates made under the same conditions have a C-axis directional optical absorption coefficient of 4.2 cm$^{-1}$ (λ=382 nm) and a thermal conductivity of 1.97 W/cmK, which are also improved as compared to the conventional example. Further, the Ge-doped portion has an electrical resistivity of 0.01 Ωcm, which is sufficiently low.

Then, the substrate is placed in the MOVPE apparatus, and a blue LED epitaxial layer 57 (FIG. 13D) including an InGaN active layer is grown subsequently thereon. It is found by photoluminescence that the in-plane distribution of emission wavelengths to the central wavelength lowers to ±2 nm.

Figure 13E:
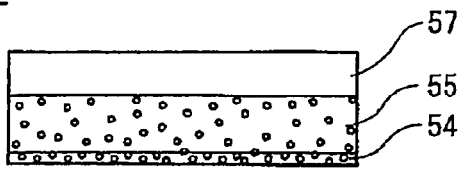
Figure 14:
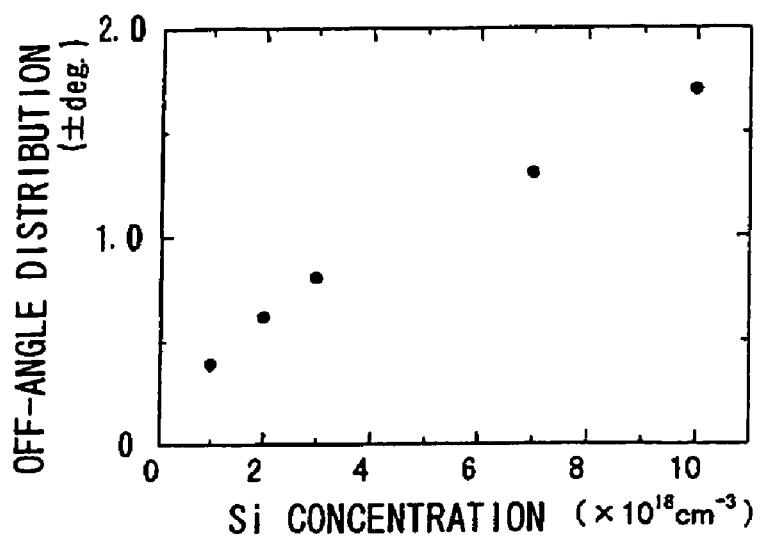
FIG. 14 is a graph showing the relationship between a Si doping concentration and a warping of GaN substrate when Si is uniformly doped into GaN.

Then, the undoped portion 53 on the bottom side of the GaN self-standing substrate 56 is removed 100 μm to expose the high Ge-doped portion 54 (FIG. 13E).

Then, it is cut into 300 μm square chips by dicing and electrodes are formed on both surfaces of the chip. The operating voltage of the chip is 4 V, which can be reduced about 30% as compared to the case without the high Ge-doped portion.

Example 6

(Example of doping As on the bottom side of the GaN thick film to further reduce the warping as well as doping Ge at a high concentration into the predetermined region in the GaN thick film)

FIGS. 17A to 17E are cross sectional views showing a method of making the GaN self-standing substrate of the sixth embodiment.

Figure 17A:
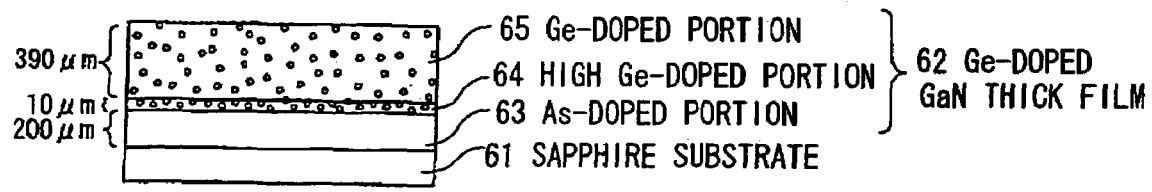
FIGS. 17A to 17E are cross sectional views showing a method of making a GaN self-standing substrate in a sixth preferred embodiment according to the invention.
Figure 17B:
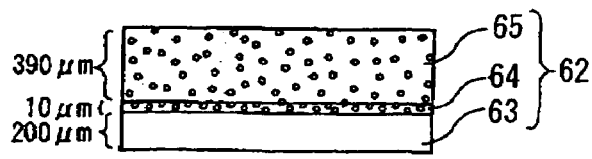

As shown in FIG. 17A, a Ge-doped GaN thick film 62 with a thickness of 600 μm is grown on a sapphire substrate 61 in a manner similar to the above conventional example. However, the As doping is conducted at a concentration of $1 \times 10^{18}$ cm$^{-3}$ from the start of the growth up to 200 μm to have an As-doped portion 63, and then the Ge doping is conducted at a high concentration of $7 \times 10^{18}$ cm$^{-3}$ from 200 μm to 210 μm to have a high Ge-doped portion 64. Then, the Ge doping is conducted at $1 \times 10^{18}$ cm$^{-3}$ in the remaining portion to have a Ge-doped portion 65 (FIG. 17A).

Figure 17C:
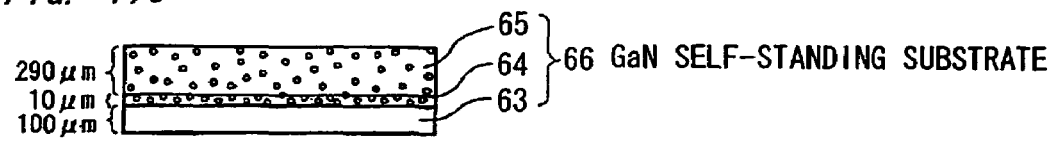
Figure 17D:
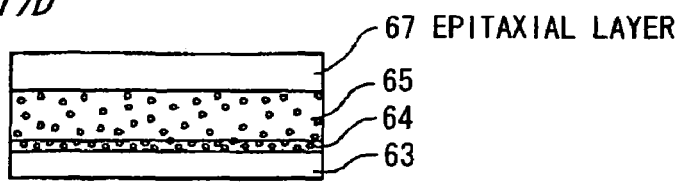

After the growth, the Ge-doped GaN thick film 62 is separated from the sapphire substrate 61 like, the conventional example (FIG. 17B) and then both surfaces thereof are polished 100 μm each to have the GaN self-standing substrate 66 with a thickness of 400 μm (FIG. 17C).

It is found by measuring the orientation distribution of this substrate by X-ray that only an orientation distribution of ±0.03 degrees at the maximum exists in φ2" plane and is significantly improved as compared to the conventional example. substrates made under the same conditions have a C-axis directional optical absorption coefficient of 5.5 cm$^{-1}$ (λ=382 nm) and a thermal conductivity of 1.92 W/cmK, which are also improved as compared to the conventional example. Further, the Ge-doped portion has an electrical resistivity of 0.01 Ωcm, which is sufficiently low.

Then, the substrate is placed in the MOVPE apparatus, and a blue LED epitaxial layer 67 (FIG. 17D) including an InGaN active layer is grown subsequently thereon. It is found by photoluminescence that the in-plane distribution of emission wavelengths to the central wavelength lowers to ±1.5 nm.

Figure 17E:
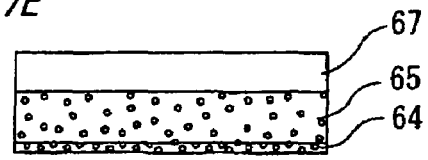

Then, the As-doped portion 63 on the bottom side of the GaN self-standing substrate 66 is removed 100 μm to expose the high Ge-doped portion 64 (FIG. 17E).

Then, it is cut into 300 μm square chips by dicing and electrodes are formed on both surfaces of the chip. The operating voltage of the chip is 4 V, which can be reduced about 30% as compared to the case without the high Ge-doped portion.

Although in the above embodiments the nitride-based semiconductor crystal (GaN thick film) is grown by HVPE, it can be grown by the other vapor-phase growth method such as MOVPE, MBE and sublimation. The dopant exemplified in the above embodiments can be replaced by various dopants such as $O_2$, C and Sn according to the object and a combination thereof. Further, the invention can be applied to all nitride-based semiconductors such as AlGaN other than GaN.

The substrate for the crystal growth can be various substrates such as SiC, GaN, Si, $ZrB_2$, ZnO, $LiAlO_2$, $NdGaO_3$ and GaAs other than that exemplified in the above embodiments. These substrates can be used in combination with any dislocation reducing methods such as VAS, ELO, PENDEO and anti-surfactant.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A group III-V nitride-based semiconductor self-standing substrate, comprising:
    a group III-V nitride-based semiconductor self-standing thick film comprising a same composition in the entire film,
    wherein the self-standing thick film comprises a first region with a predetermined impurity concentration and a second region with an impurity concentration lower than the first region.

2. The group III-V nitride-based semiconductor self-standing substrate according to claim 1, wherein:
    the self-standing thick film comprises a GaN self-standing thick film,
    the first region is doped with Si at a concentration of $1 \times 10^{18}$ cm$^{-3}$ or more and $7 \times 10^{18}$ cm$^{-3}$ or less, and
    the second region is undoped.

3. A group III-V nitride-based semiconductor self-standing substrate, comprising:
a group III-V nitride-based semiconductor self-standing thick film comprising a same composition in the entire film,
wherein the self-standing thick film comprises a first impurity to adjust a resistivity thereof and a second impurity to compensate a lattice distortion thereof caused by the first impurity.

4. A group III-V nitride-based semiconductor substrate, comprising
a group III-V nitride-based semiconductor thick film comprising a same composition in the entire film,
wherein the thick film comprises a first impurity to adjust a resistivity thereof and a second impurity to compensate a lattice distortion thereof caused by the first impurity,
wherein the first impurity and the second impurity are doped together into a predetermined region in the thick film.

5. The group III-V nitride-based semiconductor self-standing substrate according to claim 3, wherein:
the first impurity and the second impurity are doped separately into different regions in the thick film.

6. A group III-V nitride-based semiconductor substrate, comprising:
a group III-V nitride-based semiconductor thick film comprising a same composition in the entire film,
wherein the thick film comprises a first impurity to adjust a resistivity thereof and a second impurity to compensate a lattice distortion thereof caused by the first impurity,
wherein the thick film comprises a first region formed on an upper surface side thereof, a second region formed on a lower surface side thereof and a third region formed between the first region and the second region,
wherein the first region comprises the first impurity,
wherein the second region comprises the second impurity, and
wherein the third region comprises the first impurity and the second impurity each of which changes gradually in concentration.

7. A group III-V nitride-based semiconductor self-standing substrate, comprising:
a group III-V nitride-based semiconductor self-standing thick film comprising a same composition in the entire film,
wherein the self-standing thick film comprises a first region with a predetermined impurity concentration, a second region with an impurity concentration lower than the first region, and a third region formed between the first region and the second region, and
the third region comprises an impurity concentration greater than the first region.

8. A group III-V nitride-based semiconductor substrate, comprising:
a group III-V nitride-based semiconductor thick film comprising a same composition in the entire film,
wherein the thick film comprises a first region with a predetermined impurity concentration, a second region with an impurity concentration lower than the first region, and a third region formed between the first region and the second region, and
the third region comprises an impurity concentration greater than the first region,
wherein the first region is formed on an upper surface side of the thick film, the first region comprising a thickness of 100 μm or more,
wherein the second region is formed on a lower surface side of the thick film, and
wherein the third region comprises a thickness of 50 μm or less.

* * * * *